United States Patent
Keithley et al.

(10) Patent No.: US 7,425,976 B2
(45) Date of Patent: Sep. 16, 2008

(54) VARIABLE FREQUENCY GENERATOR

(75) Inventors: Douglas Gene Keithley, Boise, ID (US); Richard David Taylor, Eagle, ID (US); Mark David Montierth, Meridian, ID (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 50 days.

(21) Appl. No.: 11/471,392

(22) Filed: Jun. 20, 2006

(65) Prior Publication Data

US 2006/0238225 A1  Oct. 26, 2006

Related U.S. Application Data

(62) Division of application No. 10/903,604, filed on Jul. 30, 2004, now Pat. No. 7,145,371.

(51) Int. Cl.
| | |
|---|---|
| B41J 2/435 | (2006.01) |
| B41J 2/47 | (2006.01) |
| H03B 21/00 | (2006.01) |
| H03B 19/00 | (2006.01) |

(52) U.S. Cl. ............... 347/247; 347/237; 327/105; 327/113

(58) Field of Classification Search ........... 347/233, 347/234–237, 240, 246–250, 251–254; 327/105, 327/156, 113–122; 358/402
See application file for complete search history.

(56) References Cited

U.S. PATENT DOCUMENTS

| | | | | |
|---|---|---|---|---|
| 4,646,160 | A * | 2/1987 | Iizuka et al. | 358/402 |
| 5,107,278 | A | 4/1992 | Shimada et al. | |
| 6,294,936 | B1 * | 9/2001 | Clementi | 327/156 |
| 6,493,019 | B1 * | 12/2002 | Hirasawa | 347/233 |
| 2005/0093583 | A1 | 5/2005 | Keithley et al. | |

* cited by examiner

Primary Examiner—Hai C Pham

(57) ABSTRACT

A digital circuit generates very precise varying clock frequencies for applications that can tolerate a small degree of jitter but require exact longer term frequencies, e.g. a video clock for a laser printer. Some subpixel jitter is acceptable, but the overall pixel rate remains exact and consistent. In some applications, the jitter may be desirable to smear the EMI spectrum. For example, if the high frequency input clock is modulated, the edges of the video clock will also be modulated yet remain within the jitter and frequency specification.

11 Claims, 5 Drawing Sheets

VARIABLE FREQUENCY GENERATOR

CROSS-REFERENCE TO RELATED APPLICATIONS

This is a Divisional of application Ser. No. 10/903,604, filed on Jul. 30, 2004 now U.S. Pat. No. 7,145,371, the entire disclosure of which is incorporated herein by reference.

BACKGROUND

In the prior art, a high frequency embedded phase lock loop (PLL) can be used to provide a fixed-frequency video clock input frequency. Additional crystals or oscillators may be required to provide the desired frequency or modify the output frequency. The input frequency is fixed. Each clock requires a separate PLL. The video frequency cannot be easily changed without impacting the entire system. PLLs consume considerable application specific integrated circuit (ASIC) real estate and crystals are expensive. Changing video frequencies may require board changes. For some applications, e.g. inline laser printing, the video frequencies must be calibrated to the print engine mechanism so board changes are not practical.

In the prior art, complicated tap-delay feedback loops are used. The delay elements require custom layout. The design requires real-time calibration to adjust for process, voltage, temperature (PVT) and PVT drift. Delay elements require complicated production testing procedures, and delay elements are not portable among ASIC processes. A dithered input reference cannot be used and the output frequency spectrum cannot be easily smeared to reduce radio frequency interference (RFI). Due to the complex calibration and testing features, the design is large. In the prior art, f-theta optical lenses are used in laser printers to provide a constant velocity of the laser beam across the optical photoconductor drum. The f-theta lens is necessary because a fixed-frequency video pixel rate is used in combination with a rotating laser scanner mirror with fixed rotation velocity, which would otherwise result in a distorted image with wider pixels at the ends of the drum and narrower pixels near the middle of the drum.

SUMMARY

The present invention generates very precise varying clock frequencies for applications that can tolerate a small degree of jitter but require exact longer term frequencies, e.g. a video clock for a laser printer. Some subpixel jitter is acceptable, but the overall pixel rate must be exact and consistent. In some applications, the jitter may be desirable to smear the EMI spectrum. For example, if the high frequency input clock is modulated, the edges of the video clock will also be modulated yet remain within the jitter and frequency specification.

In its simplest form, the videoblock within a video controller receives a dithered signal, a reference signal and a beam detect signal. From these three inputs, a variable frequency signal is generated. The dithered signal may be provided by an optional modulated analog PLL that receives a reference signal, Fref. The variable frequency block receives the output of the PLL Fdither, as an input frequency and the reference signal Fref, and a Beam Detect signal from the laser to generate the video clock frequency signal Fout. Configuration registers transceive data and control with the PLL and the variable frequency block.

The variable frequency block includes a frequency request generator that receives a reference signal Fref, a dithered signal Fdither, and a Beam Detect (BD) signal. The frequency generator transceives configuration data with the a variable frequency generator, a deltaF table, and the configuration registers.

One embodiment of the variable frequency generator includes a predictor that receives a dithered signal Fdither and a reference signal Fref. A corrector receives Fdither, Fref, and the output of the predictor. The output of the corrector indicates the fractional number of clocks to remove. The predictor and corrector receive desired frequency configuration data from the frequency request generator. An accumulator receives the corrector output and Fdither. From the accumulator output and Fdither, an output generator generates an accurate frequency signal, Fout that follows the desired frequency. Each of the aforementioned blocks transceives configuration data with the configuration registers.

An alternate embodiment for the variable frequency generator receives the desired frequency configuration data from the frequency request generator. This data represents the average desired number of output clocks for n samples. Within the corrector, the error is measured from the last sample. The error is measured in a number of Fdither clocks. This error is multiplied by a scale factor register value that is used to reduce the response of the system to the last sample's error. The scaled measured error from the last sample represents the number of extra clocks to remove the next sample period. Within the predictor, the average number of high frequency (HF) clocks or Fdither clocks is measured for n samples. The difference between the measured clock periods and desired clock periods is determined. This difference is indicative of the average number of HF clocks to remove per Fref sample period. The number of extra clocks to remove the next sample period and the average number of clocks to remove per sample period are summed to determine the total number of clocks to be removed per sample period. The total number of HF clocks to remove per sample period is multiplied by another scale factor value to generate a fractional number of clocks to be removed each HF clock. This scale factor is based on the measured average number of clocks form the predictor and can be generated with a small Look-Up Table (LUT). The accumulator receives this fractional number of clocks to remove each HF clock cycle from the multiplier. The output generator will remove a clock each time the accumulator output has a value greater than 1, e.g. has overflowed.

The variable frequency generator may be applied in laser printers to eliminate the need for f-theta optical correction lenses and thereby reduce printer cost, by dynamically modifying the frequency of the video pixel rate to digitally precompensate for the distortion normally created by the sweep of the laser as it is deflected from the rotating scanner mirror. In other laser scan methodologies, such as oscillating mirror or mirror arrays, the invention can be used to compensate for the non-linearities of the laser sweep inherent in those technologies by controlling the the video pixel rate to match the velocity of the laser beam sweep across the photoconductor, pixels are placed uniformly and the resulting image is not distorted.

DETAILED DESCRIPTION

The present invention is a variable frequency video signal generator that allows the video rate to fallow the variable velocity of a laser printer without an f-theta lens. The f-theta lens is used to correct the beam velocity and beam size across the page when the beam is deflected by a rotating minor. Without the lens, the constant angular velocity of the laser bouncing off of the mirror ends up having a significant change in linear velocity as it flies across the Organic Photoconductor (OPC) drum. When a constant frequency video clock is used, the pixel change size proportional to the velocity. If the video frequency can track the velocity of the beam the pixels are placed uniformly.

An oscillating mirror can also be used to move the beam across the OPC drum instead of a rotating mirror. This oscillating mirror produces a varying linear beam velocity that is different than that of the rotating mirror. The velocity may be corrected by varying the video frequency so that it tracks the velocity of the beam. If the video frequency can track the velocity of the beam, the pixels are placed uniformly. By placing the desired frequency changes in a table, the video frequency can be controlled to follow any number of different velocity profiles.

The invention provides a method for generating very precise varying clock frequencies for applications that can tolerate a small degree of jitter but require exact long-term frequencies, e.g. a video clock for a laser printer. Some subpixel jitter is acceptable, but the overall pixel rate must be exact and consistent. In some applications, the jitter may be desirable to smear the EMI spectrum. For example, if the high frequency input clock is modulated, the edges of the video clock will also be modulated yet remain within the jitter and frequency specification.

The invention takes advantage of a known fixed reference frequency and a high speed dithered clock. A known reference interval is used to calculate how many output clock edges (or pulses) should have occurred. By comparing the expected number of output transitions to the actual, it can correct the error by "swallowing" edges or pulses on the output. This statistically reduces the cumulative error to near zero.

In operation, the variable frequency block receives a dithered signal, a stable reference signal and a beam detect signal. From these three inputs, a variable frequency signal is generated.

Figure 1:
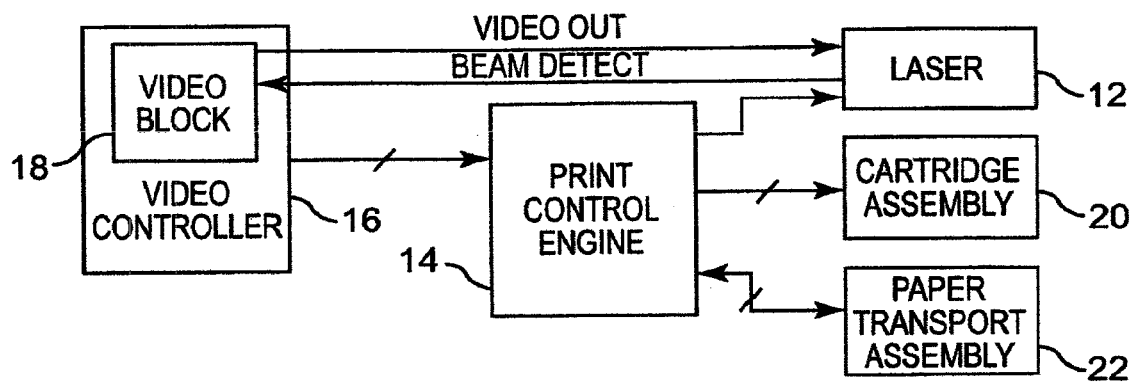
FIG. 1 discloses a functional block diagram corresponding to a printer of the present invention.

FIG. 1 discloses a functional block diagram corresponding to a printer 10 of the present invention. The printer 10 includes a single laser driver 12 and a print control engine 14. A video controller 16 that includes a scanning control circuit or video block 18 connects to the print control engine 14 and the laser driver 12. The system further includes a cartridge assembly 20 and a paper transport assembly 18 in communication with the print control engine 22.

Figure 2:
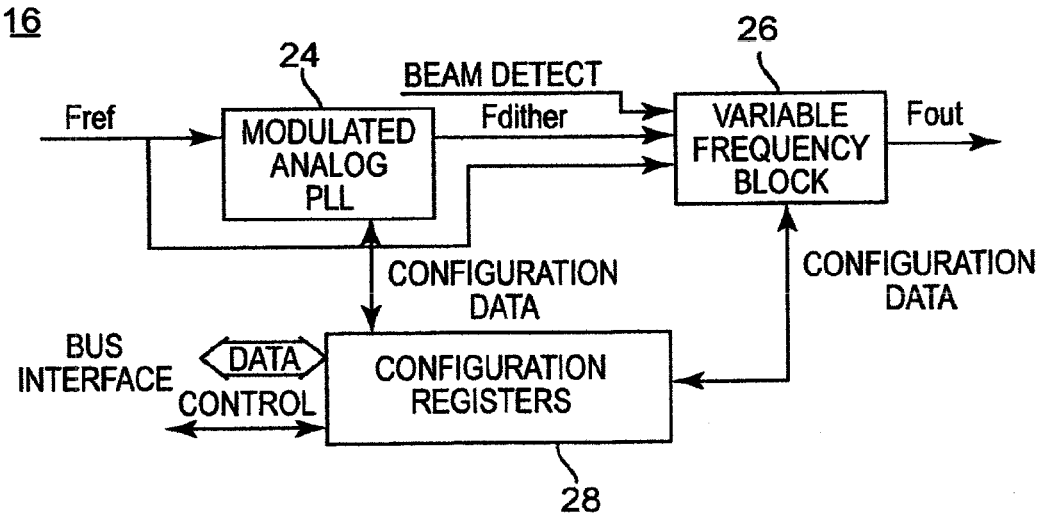
FIG. 2 is a functional block diagram of a video controller of the present invention.

FIG. 2 is a functional block diagram of a video controller 16 of the present invention. An optional modulated analog PLL 24 receives a reference signal, Fref. A variable frequency block 26 receives the output of the PLL, Fdither, as an input frequency, the reference signal Fref, and the Beam Detect signal to generate the video clock frequency signal Fout. Configuration registers 28 transceive data and control with the PLL 24 and the variable frequency block 26.

In an illustrative application, a laser printer controller requires an exact pixel rate of 20.12345 MHz at the maximum velocity of the beam. Subpixel resolution is required in the output signal. The video clock generated may be up to 12 times that frequency (12*20.12345 MHz=241.4814 MHz). The rest of the controller system needs a ~250 MHz clock and a fixed I/O frequency of 48.000 MHz. The ~250 MHz clock will be further modulated to reduce EMI. The video frequency will be generated from clocks already in the system, e.g. 48.000 MHz and 500 +/−10 MHz from the PLL. Fout cannot exceed half of the slowest frequency, e.g. 245 MHz. The video output should be the highest multiple of the video frequency possible while remaining lower than half of the slowest dithered input clock.

Figure 3:
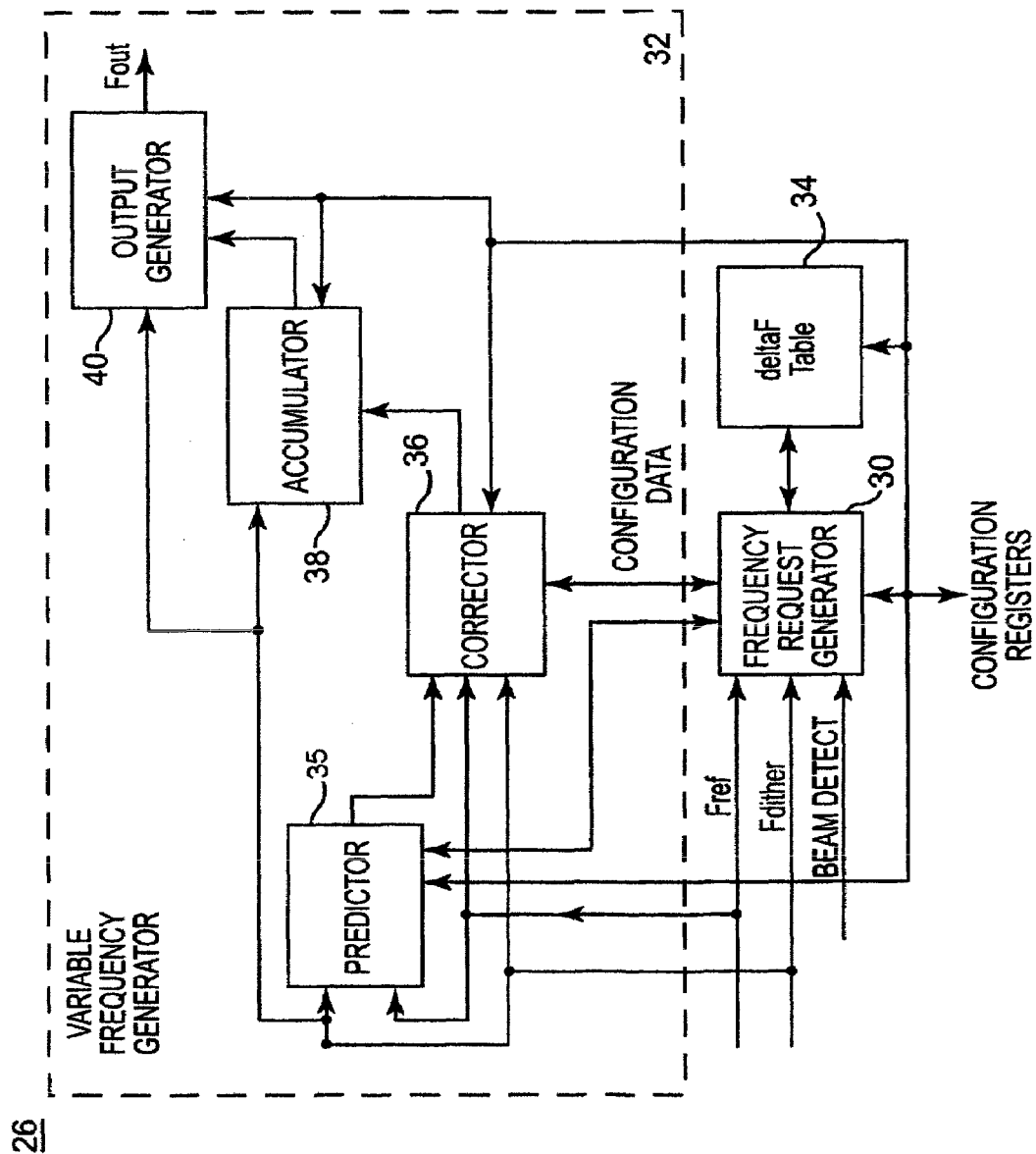
FIG. 3 is a functional block diagram of a variable frequency block 26 shown in FIG. 2.

FIG. 3 is a functional block diagram of a variable frequency block 26 according to the present invention. A frequency request generator 30 receives a reference signal Fref, a dithered signal Fdither, and a Beam Detect (BD) signal. The frequency request generator 30 transceives configuration data with the variable frequency generator 32, a deltaF table 34, and the configuration registers 28 (shown in FIG. 2).

The variable frequency generator 32 includes a predicator 35 that receives a dithered signal Fdither and a reference signal Fref. A corrector 36 receives Fdither, Fref, and the output of the predictor 35. The output of the corrector 36 indicates the fractional number of clocks to remove. The predictor 35 and corrector 36 receive desired frequency configuration data from the frequency request generator 30. An accumulator 38 receives the corrector output and Fdither. From the accumulator output and Fdither, an output generator 40 generates a precise frequency signal, Fout that follows the desired frequency. Each of the aforementioned blocks transceives configuration data with the configuration registers 28 (shown in FIG. 2).

The embodiment disclosed in FIG. 3 can handle removing many pulses during each sample period in a very nice way. This implementation provides more flexibility to chose frequencies since it is able to remove more than one pulse per sample period.

Figure 4:
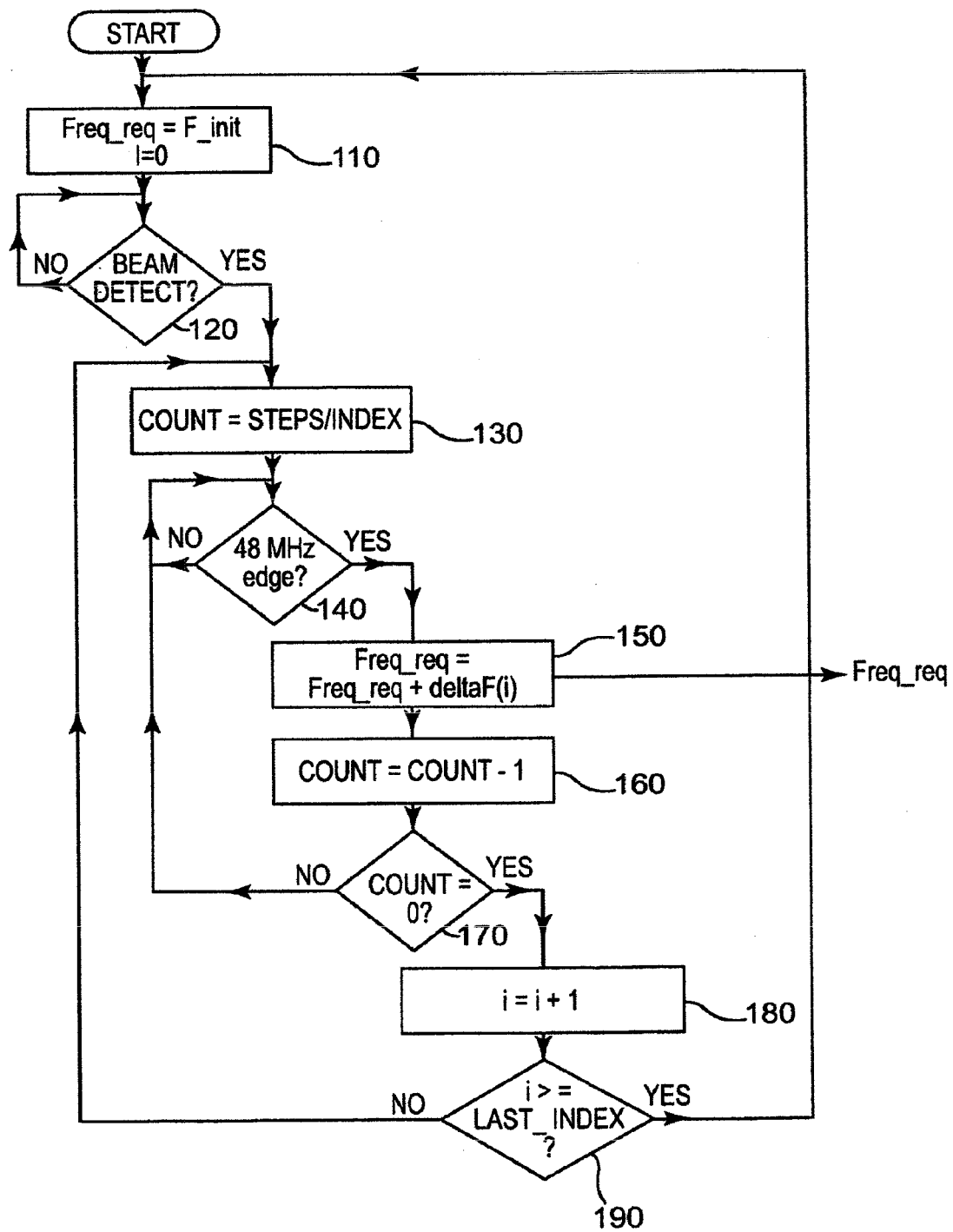
FIG. 4 illustrates a flowchart for the frequency request generator corresponding to the present invention.

FIG. 4 illustrates a flowchart for the frequency request generator 30 corresponding to the present invention. This generator will construct a series of connected straight lines that will approximate a velocity profile. The output will be updated every Fref (48 MHz in this example) clock. Each update is referred to as a 'step'. Each linear segment will be represented by a fixed number of steps, and a single table entry that represents the slope of the line (deltaF). Each table entry in the deltaF table is a signed value so that the slope can be positive or negative.

In step 110, the requested frequency value (Freq_req) and index (i) are initialized. In step 120, it is determined if the beam is detected. If no, then repeat step 120. If yes, then in step 130, "count" is set to the total number of steps divided by the number of table entries, e.g. steps per index. In step 140, is the edge of the fixed frequency clock detected? If no, repeat step 140. If yes, then in step 150, Freq_req is set to Freq_req+ deltaF(i). The Freq_req corresponds to the desired frequency configuration data that is used by the predictor. In step 160, count is decremented by 1. In step 170, it is determined if count is equal to zero. If no, then repeat step 140. If yes, then in step 180, index i is incremented and the next table entry will be used. In step 190, it is determined if index i is greater than or equal to the last_index to see if the entire table has been traversed. If no, repeat step 130. If yes, then repeat step 110.

By using even a small number of linear segments, an excellent approximation to the rotating mirror and oscillating mirror velocity curves can be achieved.

Figure 5:
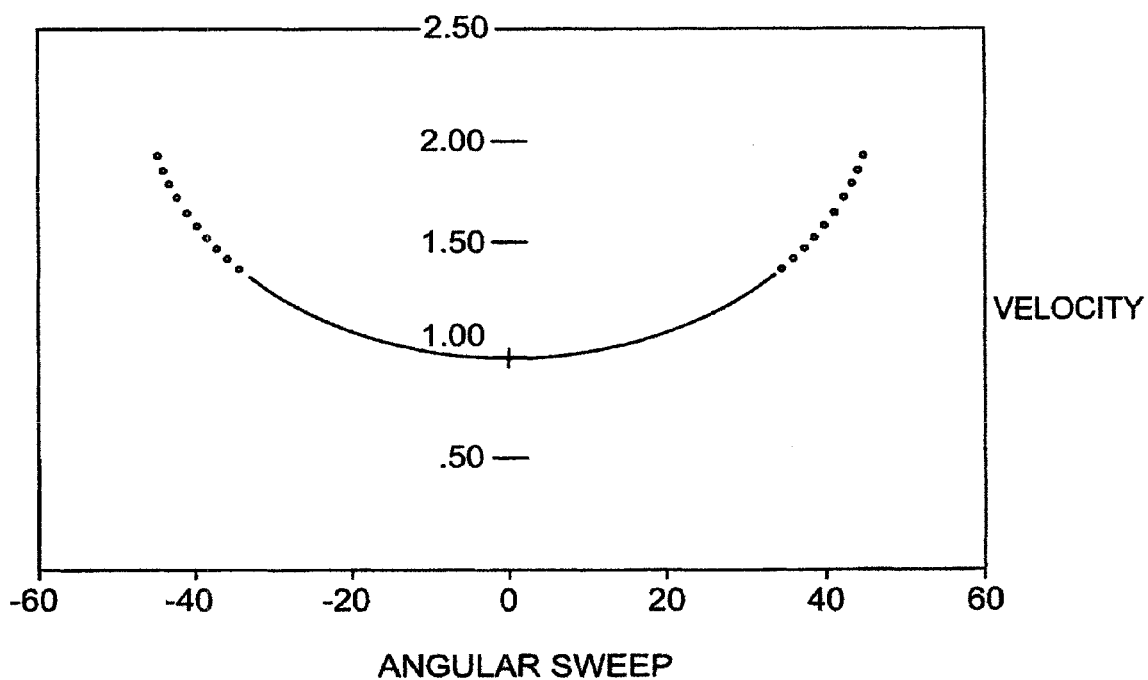
FIG. 5 illustrates the linear velocity derived from a constant angular velocity system (laser printer without f-theta lens).

In an illustrative embodiment, shown in FIG. 5, the linear velocity is derived from a constant angular velocity system (laser printer without f-theta lens). The beam will hit the OPC drum between the angles of −45 degrees to +45 degrees. The velocity profile is then approximated using a piecewise linear set of 90 line segments. This equates to one line segment for each of the degrees of scanning.

For each of the linear segments, the slope is determined by the fractionally encoded value in the deltaF table. In this embodiment, only 6 bit signed values are used, e.g. 90 entries×6 bits=540 bits of table values. The desired frequency is updated using the fixed frequency Fref clock, e.g. 48 MHz. A simple accumulator is updated with this value every clock cycle and the delta value is changed at a fixed interval (number of 48 MHz clocks per degree change in angular position).

Since the beam velocity is synchronized with the Beam Detect (BD) signal, the generation of the frequency profile must also be synchronized to the BD signal. When necessary, a separate counter value can be added to delay the start of the velocity profile from the BD signal.

Figure 6:
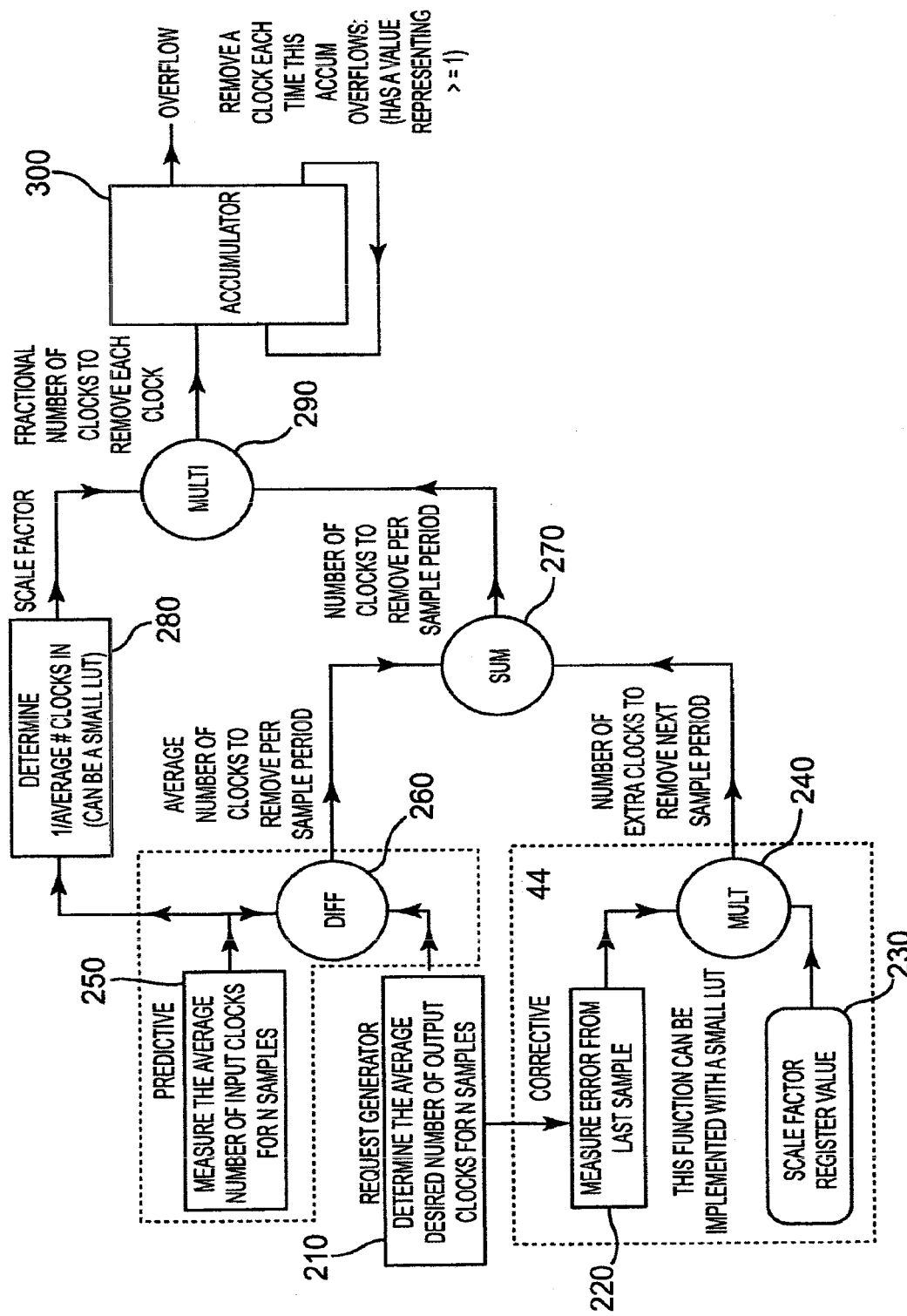
FIG. 6 is an alternate flow process diagram 200 corresponding to the variable frequency generator shown in FIG. 4.

FIG. 6 is a flow process diagram 200 corresponding to an alternate embodiment for the variable frequency generator 32 shown in FIG. 4.

In step 210, the frequency request generator 30 determines the average desired number of output clocks for n samples and passes this value on to the predictor and corrector.

Within the variable frequency generator, the following steps occur in a corrective block. In step 220, the error is measured from the last sample. In step 230, the scale factor used to lower the sensitivity to the measured error retrieved from a configuration register. In step 240, the measured error from the last sample is multiplied by the scale factor value to generate an output representing the number of extra clocks to remove the next sample period.

Within the variable frequency generator, the following steps occur in a predictive. In step 250, the average number of high frequency (HF) clocks or dithered clocks is measured for N samples. N may be programmed by the user via the configuration registers. This may be implemented by a counter. In step 260, the difference between the measured clock periods and desired clock periods is determined. This difference is indicative of the average number of HF clocks to remove per sample period.

In step 270, the number of extra clocks to remove the next sample period (from step 240) and the average number of clocks to remove per sample period (from step 260) are summed to determine the number of clocks to remove per sample period. In step 280, the reciprocal of the output value of step 250 is calculated and presented as a scale factor. The reciprocal can be generated by a small Look-Up Table (LUT). In step 290, the number of HF clocks to remove per sample period (from step 270) is multiplied by the scale factor from step 280. The output corresponds to the fractional number of clocks to remove each HF clock period. In step 300, the accumulator receives the fractional number of clocks to remove each clock cycle from the corrector. The output generator will remove a clock each time the accumulator output has a value greater than 1, e.g. has overflowed.

In operation, the predictive block derives the average number of clocks to be removed each sample period. A sample period is defined by the known fixed reference frequency, e.g. 48 MHz.

Since this average is close, but not perfect, the corrector derives a correction value based on a single sample comparison of a counter based on the generated clock and a predicted count. The output from this comparator may request a pixel or two be removed or added to the next sample. This can be scaled so that the feedback amount does not correct so quickly.

The correction values are summed together. This sum represents how many clocks need to be removed or added during the next sample period. This number of clocks to be removed or added is next divided by the average number of clocks coming in per sample period so that a "fractional number of clocks to be removed each HF clock" value can be generated. A small LOOK UP TABLE (LUT) that can generate the reciprocal for a small set of values generates the scalar, which is then multiplied by the number of clocks to be removed. The resulting fractional value represents the portion of a clock to be removed for each clock.

The value is fed into the accumulator that sums this difference for every clock. When there is an overflow condition, the next clock is removed.

The frequency request value generator may be replaced with a larger table or could be read from memory.

We claim:

1. A printer comprising:
   a laser driver; and
   a video controller coupled to the laser driver, the video controller comprising:
      a variable frequency block configured to receive a reference frequency, a dithered frequency, and a beam detect signal, and generate therefrom a video clock frequency signal that is provided to the laser driver;
      a frequency request generator configured for providing to the variable frequency block, configuration data pertaining to a desired frequency; and
      a configuration register coupled to the frequency request generator for providing configuration data to the frequency request generator.

2. A printer, as defined in claim 1, further comprising a modulated analog phase lock loop, configured for receiving the reference frequency and generating therefrom, the dithered frequency that is provided to the variable frequency block.

3. A printer, as defied in claim 1, the variable frequency block comprising:
   a predictor configured to generate a first output signal indicative of an average number of clocks to remove per sample period;
   a corrector configured to generate a corrector value indicative of a number of clocks to be removed or added over a next sample period;
   an accumulator configured for receiving the corrector value and the first output signal and generate therefrom, an accumulator output; and
   an output generator, configured for receiving the accumulator output, the output generator further configured for generating the video clock frequency signal that is provided to the laser driver.

4. A printer, as defined in claim 3, wherein the corrector value is further indicative of a fractional number of clocks to be removed or added over the next sample period.

5. A printer, as defined in claim 4, wherein the corrector comprises a look up table (LUT) configured to provide a scale factor that is used for generating the corrector value indicative of the fractional number of clocks to be removed or added over the next sample period.

6. A printer, as defined in claim 1, the variable frequency block comprising:
   predictive means for generating a first output signal indicative of an average number of dithered periods to remove per reference period;

corrective means for generating a second output signal indicative of a fractional number of dithered periods to remove each reference period;

an adder for receiving the first and second output signals, generating a third output signal indicative of a number of clocks to remove per reference period;

a scale factor;

a multiplier, for receiving the scale factor and the third output signal, generating a fourth output signal indicative of the fractional number of clocks to remove each clock period; and an accumulator, for receiving the fourth output signal, operative to count the fractional number of dithered periods, removing a dithered period when an integer has been reached.

7. A printer, as defined in claim 6, the corrective means comprising:

error measuring means for measuring an error from a last sample and generating an error signal;

a scale factor register value for generating a scale factor; and a multiplier, for receiving the error signal and the scale factor, and generating therefrom, the second output signal.

8. A printer, as defined in claim 1, further comprising:

a cartridge assembly;

a paper transport assembly; and a print control engine coupled to the cartridge assembly and the paper transport assembly, the print control engine configured to be controlled by the video controller.

9. A printer, as defined in claim 1, wherein the video controller further comprises:

a direct memory access (DMA) block; and a video processor; and wherein the configuration register is further coupled to the DMA block, the video processor, and the variable frequency block.

10. A printer, as defined in claim 1, wherein the frequency request generator is configured to receive the reference frequency, the dithered frequency, and the beam detect signal.

11. A printer, as defined in claim 1, wherein the video controller further comprises:

a deltaF table coupled to the frequency request generator, the deltaF table containing at least one table entry that represents a slope of a portion of a velocity profile of the printer.

* * * * *